Figure 1:
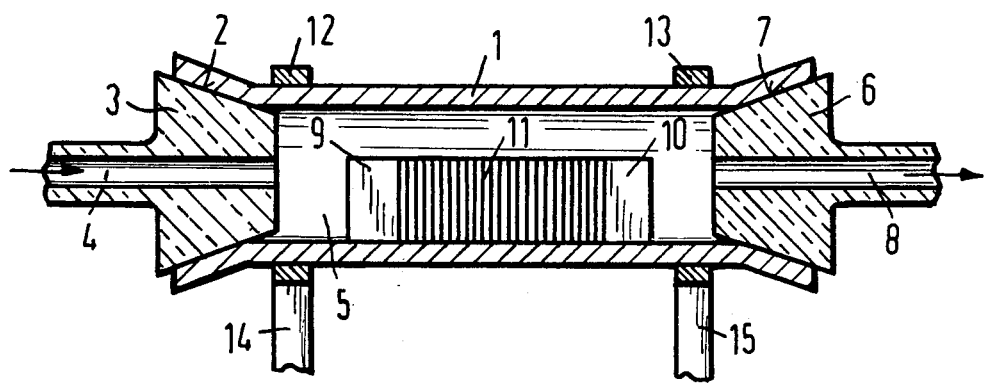

United States Patent [19]

Reuschel et al.

[11] 4,020,791

[45] May 3, 1977

[54] APPARATUS FOR INDIFFUSING DOPANTS INTO SEMICONDUCTOR MATERIAL

[75] Inventors: Konrad Reuschel, Vaterstetten; Wolfgang Keller, Pretzfeld; Arno Kersting, Erlangen; Reimer Emeis, Ebermannstadt, all of Germany

[73] Assignee: Siemens Aktiengesellschaft, Munich, Germany

[22] Filed: Nov. 19, 1974

[21] Appl. No.: 525,176

Related U.S. Application Data

[60] Division of Ser. No. 295,173, Oct. 5, 1972, Pat. No. 3,868,924, which is a continuation of Ser. No. 50,087, June 26, 1970, abandoned.

[30] Foreign Application Priority Data

June 30, 1969  Germany .......................... 1933128

[52] U.S. Cl. .................................. 118/49.1; 13/20; 219/390
[51] Int. Cl.² ......................................... C23C 13/08
[58] Field of Search ............................ 118/48–49.5, 118/6, 620, 64; 219/388, 390; 13/25, 20; 117/50–52

[56] References Cited

UNITED STATES PATENTS

| | | | |
|---|---|---|---|
| 2,679,545 | 5/1954 | Kistler | 13/20 |
| 2,936,246 | 5/1960 | Coghill | 118/49 |
| 2,948,635 | 8/1960 | Koller | 118/49.1 X |
| 3,099,579 | 7/1963 | Spizer et al. | 118/48 X |
| 3,293,074 | 12/1966 | Nickl | 118/49.5 X |
| 3,441,000 | 4/1969 | Burd et al. | 118/49.1 |
| 3,486,933 | 12/1969 | Sussman | 148/175 UX |
| 3,492,969 | 2/1970 | Emeis | 118/49.1 |

Primary Examiner—Mervin Stein
Attorney, Agent, or Firm—Herbert L. Lerner

[57] ABSTRACT

Apparatus for indiffusing dopant into a semiconductor material. The apparatus comprises a heatable tube of the same semiconductor material, the wall of which is from 0.5 to 20 mm thick and is gas-tight under reaction conditions.

4 Claims, 2 Drawing Figures

APPARATUS FOR INDIFFUSING DOPANTS INTO SEMICONDUCTOR MATERIAL

This application is a division of application Ser. No. 295,173, filed Oct. 5, 1972, now U.S. Pat. No. 3,868,924 issued Mar. 4, 1975, which in turn is a continuation of application Ser. No. 50,087, filed June 26, 1970, now abandoned.

A known apparatus for indiffusing dopants into a semiconductor material comprises a sealable graphite tube wherein both wafers of the semiconductor material to be coated, and the dopant substance are accommodated. To effect diffusion, the graphite tube is connected to voltage and heated to diffusion temperature. The heated graphite tube is surrounded by a quartz tube, through which an inert gas is passed. This inert gas cools the quartz tube and thus prevents impurities in the atmosphere from contacting the semiconductor material to be coated.

The construction of this apparatus is relatively expensive, however. Moreover, the semiconductor material must not come into contact with the graphite tube since, at the diffusion temperatures the carbon reacts undesirably with the semiconductor material. Hence, the graphite tube is provided with special holders, which prevent the semiconductor wafers and the graphite tube from contacting each other.

It is also known to diffuse dopants into a semiconductor material by utilization of quartz tubes or quartz ampules which are heated in a diffusion furnace. The use of quartz tubes or ampules entails similarly, the problem of preventing the semiconductor wafers from contacting the quartz. To this end, a support disc is usually provided between 10 to 20 semiconductor wafers in such a quartz tube. The semiconductor wafers are so pressed in between the support disc that they do not contact the quartz tube at any point along its circumference. The use of a plurality of such support discs naturally results in less semiconductor wafers being doped during one operating process. The use of quartz tubes also has the disadvantage that the diffusion temperature is limited to approximately 1,200° C. since at this temperature, quartz softens. The supporting discs prevent the quartz tube from compressing the wafers to be diffused and from damaging them when the quartz tube, following diffusion, is removed. The diffusion speed is relatively low at 1,200° C. The use of quartz tubes, moreover, demands special diffusion furnaces, since neither direct heating nor induction heating is applicable.

It has also been suggested to provide a heatable tube of the same semiconductor material, instead of a quartz or graphite tube, for diffusion to take place. This type of tube can withstand higher temperatures than a tube of quartz or graphite for example, thus allowing the diffusion process to be accelerated. Furthermore, the material to be coated may come into contact with the tubular wall without producing adverse results. The semiconductor tube of the prior art, is installed into a vacuum chamber, wherein the tube is heated to effect diffusion.

Our invention is to devise an arrangement of the aforedescribed type, which makes such a vacuum chamber superfluous, thus simplifying the apparatus. Our invention starts with apparatus for the indiffusion of dopants into a semiconductor material provided with a heatable tube consisting of the same semiconductor material. The invention is characterized by the fact that the wall of the tube is 0.5 mm to 20 mm thick and therefore virtually gas-tight under the indiffusion conditions. The tube is preferably a bored out rod of a crystalline semiconductor material. It may also consist, however, of semiconductor material precipitated through thermal dissociation of a gaseous compound of the semiconductor material, on a heated carrier body, with the carrier body being removed following precipitation of the semiconductor material.

Preferably, the tube itself constitutes the heating body. For this purpose, its ends may be provided with electrodes or they may be enclosed by an induction coil. To facilitate the heating up of the tube, during induction heating, a ring of material with good conductance properties may be placed upon the tube. The tube may be sealed on both sides for carrying out the diffusion process. The dopant and the semiconductor material are placed into the interior of the tube, prior to the sealing thereof. However, the tube may also be open on both sides, and the dopant together with an inert carrier gas, traversing the tube.

Figure 2:
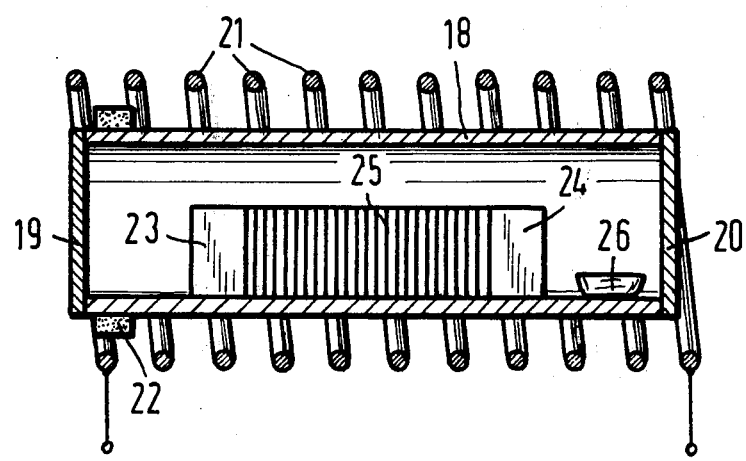

The invention further illustrated by the drawing, in which:

FIG. 1 shows a longitudinal section through a first embodiment of the invention; and FIG. 2 shows a longitudinal section through another embodiment of the invention.

The arrangement of FIG. 1 has, primarily, a tube 1 of a crystalline semiconductor material, for example silicon which may have a wall thickness of about 0.5 to 20 mm. A ground section 2 is provided at its left end, of the tube 1 with ground stopper 3, e.g. of quartz fitted thereinto. The stopper 3 has an opening 4 to the interior 5 of the tube 1. The right side of the tube 1 has a ground section 7 with a stopper 6 hermetically fitted thereinto. The stopper 6 has an opening 8, which connects to the interior 5 of the tube. The interior 5 of the tube 1 contains semiconductor wafers 11, e.g. of silicon which are held in their position by two support discs 9 and 10. The support discs are preferably of the same semiconductor material as discs 11, but may be of another material such as ceramic. The tube 1 is provided in the vicinity of its ends, with two annular electrodes 12 and 13, which have leads 14 or 15 connected to a voltage source (not shown in detail).

The diffusion process is effected by first of all arranging the semiconductor wafers 11 between support discs 9 and 10, in the interior of the tube 1. Thereafter, stoppers 3 and 6 are gas-tightly placed in the tube and the nipples 4 or 8 of stoppers 3 and 6 respectively are connected to the dopant source. The other nipple serves as the waste outlet. The doping substance is preferably carried by an inert gas, e.g. argon, through the interior of the tube. If n-doping is desired, a preferred substance is phosphorus in the form of $P_2O_5$, $PCl_3$ or $(PNCl_2)_3$. $PH_3$ is also a suitable dopant. The carrier gas may be a noble gas such as argon or helium or another inert gas.

To obtain required diffusion temperature, a voltage source is applied to the tube 1 via both electrodes 12 and 13 and both leads 14 and 15. The voltage is such that the current required for heating-up tube 1 flows. In addition to being dependent upon the dimensions of the tube, the voltage also depends on the conductivity of the semiconductor material.

If a highly doped semiconductor material, which is relatively easy to produce, is used for the tube, the voltage required for starting the heating-up process, can be relatively low. When a certain heating-up temperature is attained, the conductivity of the tube then becomes independent of the doping of the semiconductor material and is essentially determined by the dimensions of the tube.

The tube is preferably of the same semiconductor material, as wafers 11. For example, when the wafers 11 comprise silicon, a tube of crystalline silicon is employed. Such a tube can be created by drilling out a rod of crystalline silicon. The tube may also comprise silicon which it precipitated through thermal dissociation of a gaseous compound or the silicon, on a heated carrier body, with the carrier body being removed following the precipitation of the silicon. Contrary to layers of sintered silicon, this precipitated layer of crystalline silicon, is highly gas-impermeable, at an appropriate wall thickness. Thus, for example, in a tube having a wall thickness of 2 mm, a tubular length of 150 mm and an inner diameter of 20 mm, a leakage rate of only $3.10^{-5}$ Torr liter/s, was established. Satisfactory results were obtained even at a wall thickness of about 0.5 mm. The upper limit is about 20 mm since no further improvements can be obtained above this limit.

The use of a silicon tube has the further advantage that it is heatable to much higher temperatures than quartz, without the resulting loss of its mechanical stability and its gas impermeability, as in the case of the former. In practice this means that the diffusion process may be fundamentally accelerated compared to a diffusion in a quartz tube or a quartz ampule. Since the semiconductor wafers 1 in this instance the silicon wafers, do not enter into a chemical reaction with the silicon of the tube 1, the latter may be seated directly on the wall of the tube 1. It is sufficient, therefore, to provide only two support discs, as holders for the wafers.

FIG. 2 shows another embodiment according to the invention. This arrangement is essentially a tube 18, consisting of an homogenous, crystalline semiconductor material, for example silicon. The tube 18 is gas-tightly sealed with two lids 19 and 20, which consist of the same semiconductor material. The tube 18 is surrounded by induction coil 21. A ring 22 of a material with good conductance properties, such as graphite, is seated upon the tube 18. The interior of the tube 18 is provided with two support discs 23 and 24, with semiconductor wafers 25, for example of silicon arranged therebetween. A boat 26 holding the dopant is in the interior of the tube. This boat consists preferably of the same material as the tube 18.

Firstly, the lid 20 is placed upon the tube and welded gas-tightly to the tube 18, in a vacuum or protective gas, with the aid of high-frequency energy. Thereafter, the boat 26, the support discs 23 and 24 and the semiconductor wafers 25, are placed into the tube interior. Finally, lid 19 is placed upon the tube and is welded gastightly with the tube 18 in a vacuum or in protective gas with the aid of high-frequency energy. Thereafter, a highfrequency voltage is applied to the induction coil 21. This high-frequency voltage results in a current in the graphite ring 22, which heats the graphite ring 22 and thereby also the left part of the tube 18. The temperature increase reduces the specific resistance in that part of the tube 18 so that the current necessary for heating up the tube, can now flow in said part. The heating zone, starting from the zone of the tube adjacent to the graphite ring, expands across the entire length of the tube. The temperature of the tube is determined thereby, by the high-frequency current.

The same advantage as for embodiment according to FIG. 1 therefore applies for the embodiment according to FIG. 2. Here too, a considerably higher diffusion temperature and thus a higher diffusion speed can be obtained than for example, in a quartz ampule. The semiconductor wafers 25, for example of silicon, may be seated without difficulty on the wall of the tube 18 when the tube also consists of silicon, for instance. No chemical reaction occurs than between the silicon wafers and the tubular wall.

Embodiments other than those shown in FIG. 1 and 2 are feasible. It is possible, for example, to use the resistance heat shown in FIG. 1 in a completely closed tube according to FIG. 2. Conversely, an open tube of a compound of the dopant, passed by a carrier gas, according to FIG. 1, may also be heated by an induction heat, according to FIG. 2. The invention is not limited to a device for the diffusion of wafers comprising silicon, with tubes made of silicon. It is also possible to use tubes of for example, silicon carbide, tungsten carbide, titanium carbide, indium phosphide, gallium arsenide, boron nitride or germanium.

We claim:

1. Apparatus for indiffusing dopants into a semiconductor material which comprises a heatable tube of the same semiconductor material in which the semiconductor material is accomodated and in which the doping substance is found, said semiconductor material of said heatable tube being doped to permit low voltage for starting heating-up of said tube, the wall of the tube is from 0.5 to 20 mm thick, is virtually gas-tight under diffusion conditions, said heatable tube having attached thereto an electrode near each of its ends, and means connected to said electrodes for passing an electric current directly through said heatable tube along its entire length from one electrode at one end of the tube to the other electrode at the other end of the tube to cause said tube to become heated along its entire length.

2. The apparatus of claim 1, wherein the tube is of a semiconductor material selected from silicon, germanium, silicon carbide, tungsten carbide, titanium carbide, indium phosphide, gallium arsenide and boron nitride.

3. The apparatus of claim 1, wherein each end of said tube is covered with a lid of the same semiconductor material as said tube.

4. The apparatus of claim 1, wherein a stopper closes each end of said tube, an opening in each of said stoppers, the opening in one of said stoppers serving for the introduction of doping substance.

* * * * *